US012689369B2

(12) United States Patent
Haiplik et al.

(10) Patent No.: US 12,689,369 B2
(45) Date of Patent: Jul. 21, 2026

(54) SWITCHING CONTROL

(71) Applicant: Cirrus Logic International Semiconductor Ltd., Edinburgh (GB)

(72) Inventors: Holger Haiplik, Swindon (GB); Peter Tonge, Newbury (GB)

(73) Assignee: Cirrus Logic Inc., Austin, TX (US)

( * ) Notice: Subject to any disclaimer, the term of this patent is extended or adjusted under 35 U.S.C. 154(b) by 142 days.

(21) Appl. No.: 18/519,665

(22) Filed: Nov. 27, 2023

(65) Prior Publication Data

US 2024/0340003 A1     Oct. 10, 2024

Related U.S. Application Data

(60) Provisional application No. 63/494,611, filed on Apr. 6, 2023.

(51) Int. Cl.
H03K 17/687          (2006.01)

(52) U.S. Cl.
CPC .................................. H03K 17/687 (2013.01)

(58) Field of Classification Search
CPC .................................................... H03K 17/687
See application file for complete search history.

(56) References Cited

U.S. PATENT DOCUMENTS

| | | | | |
|---|---|---|---|---|
| 6,429,633 B1 * | 8/2002 | Kajiwara | ............. | H03K 17/164 |
| | | | | 323/283 |
| 9,806,616 B2 * | 10/2017 | Knoedgen | ............... | H02M 1/08 |
| 12,261,532 B2 * | 3/2025 | Zhou | ................... | H02M 3/1566 |

* cited by examiner

*Primary Examiner* — Menatoallah Youssef
*Assistant Examiner* — Colleen J O Toole
(74) *Attorney, Agent, or Firm* — Jackson Walker L.L.P.

(57) ABSTRACT

This application relates to methods and apparatus for switching control of semiconductor switches. In a switching circuit, a semiconductor switch is implemented as a composite switch having a plurality of switch elements, each having a respective gate electrode. A switch driver is configured to drive the gate electrodes of the switch elements to a first gate voltage over a duration of a first switch transition and is configured to enable drive of at least some of the gate electrodes of the plurality of semiconductor switch elements at different times in a temporal sequence during the first switch transition. The temporal sequence is configured to provide an average resistance of the composite switch over the duration of the first switch transition which is closer to a final composite switch resistance, compared to driving the gate electrodes of the switch elements at the same time as one another.

22 Claims, 5 Drawing Sheets

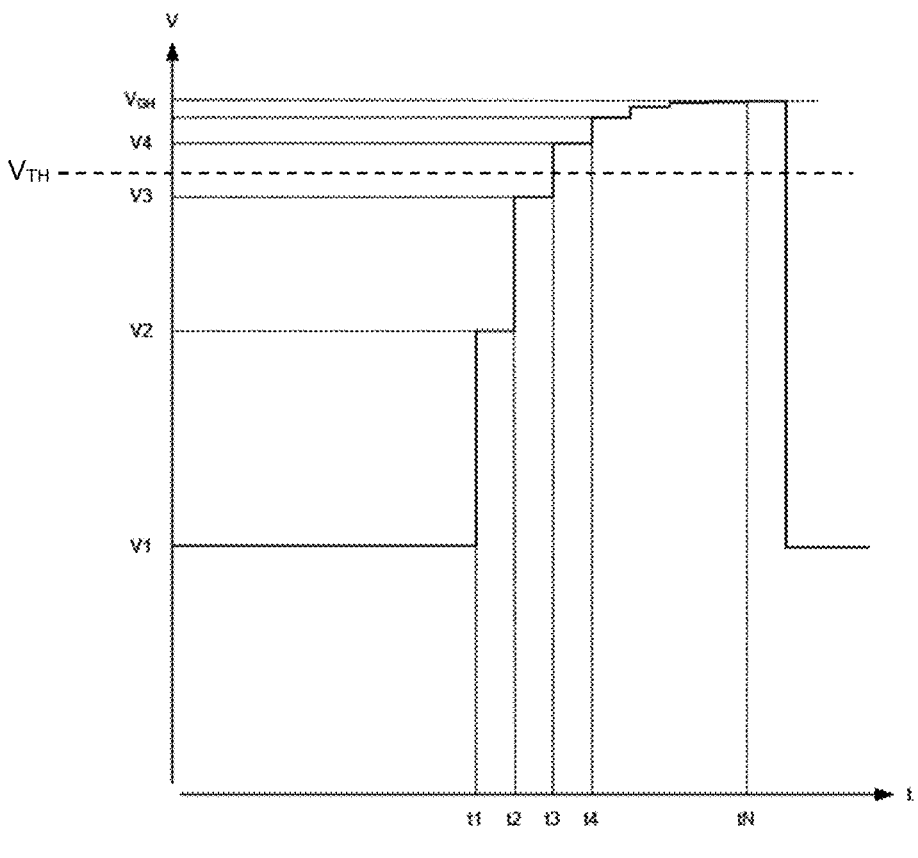
Figure 3
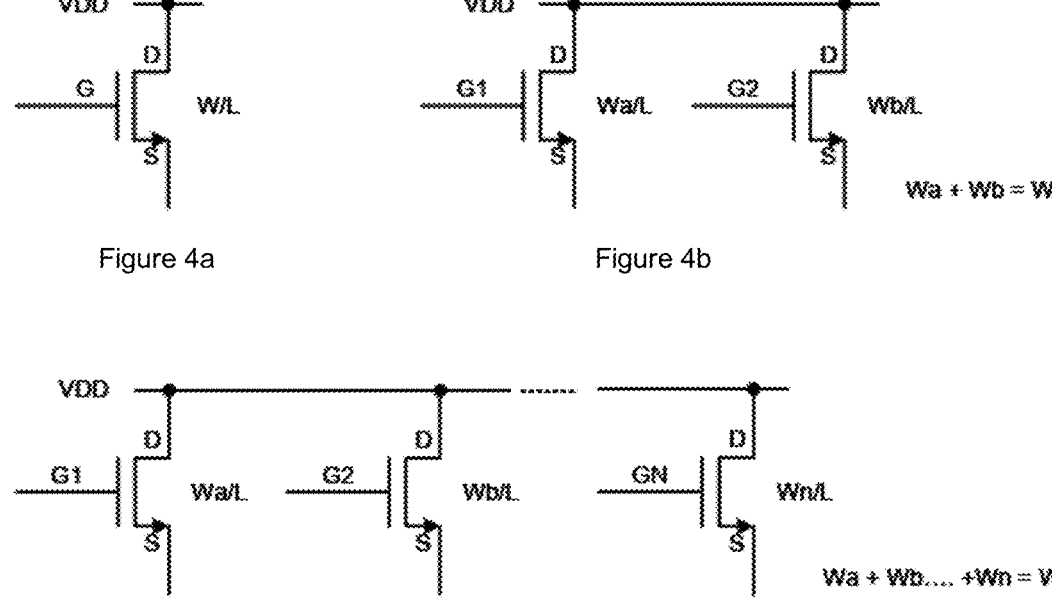
Figure 4a              Figure 4b
Figure 4c

SWITCHING CONTROL

FIELD OF DISCLOSURE

The field of representative embodiments of this disclosure relates to methods, apparatus and/or implementations concerning or relating to switching control, in particular for control of switching of semiconductor switches such as MOS switches, and especially for switching control of a switch of a switching circuit such as an output stage or power stage.

BACKGROUND

Some electronic circuits have an output stage, which may sometimes be referred to as a power stage, for outputting an output voltage to downstream components, e.g. for outputting a controlled output voltage to a load, where the output stage comprises switches for selectively connecting an output node to defined voltages to generate the output voltage. For instance, an output stage may comprise high-side and low-side switches connected in series between high-side and low-side voltage nodes or rails, with the output node connected between the switches. The high-side and low-side switches may be switched in sequence, e.g. with a controlled duty-cycle, to generate the desired output voltage at the output node.

Note that as used herein, the terms 'high' and 'low' in relation to voltages shall be taken to mean more positive/less negative and less positive/more negative respectively, and the terms 'high-side' and 'low-side' should be construed accordingly. In some examples, the low-side voltage may be ground.

The high-side and low-side switches of the output stage may conveniently be implemented by MOS devices, and, in at least some applications, NMOS switches may be preferred, as the circuit area required for a NMOS switch can be smaller than that required for a PMOS switch of an equivalent on-resistance, and, in general, it is desirable for a smaller circuit area where possible. Typically the NMOS switches may be implemented as enhancement-mode NMOS switches.

FIG. 1 illustrates one example of an output stage 100 comprising two NMOS switches coupled in series; a high-side NMOS switch $N_H$ and a low-side NMOS switch $N_L$. The drain (D) terminal of the high-side switch $N_H$ is coupled to the high-side voltage, which in this example is a positive supply voltage VDD, and the source (S) terminal of high-side switch $N_H$ is coupled, via the output node 101, to the drain terminal (D) of low-side switch $N_L$. The source (S) terminal of the low-side switch $N_L$ is coupled to the low-side voltage, which in this example is a ground voltage GND. The output node 101, is coupled, in use, to a load 102, which in this example is connected between the output node and the low-side voltage GND.

Such an output stage may be used in a variety of applications, for instance as part of a power regulator for supplying the output voltage $V_{OUT}$ as a regulated power supply to the load, or as part of a switching driver, such as a class-D amplifier or the like, for driving the load with $V_{OUT}$ as a drive signal, in which case the load may be a transducer such as an audio or haptic output transducer or the like. It will be understood that, depending on the application, there may be other configuration for connection of the load 102, e.g. for a driver application the load could be connected in a single-ended configuration as illustrated or could be connected in a bridge-tied-load configuration between two driver output stages. In some applications there may be some additional components between the output node 101 and the load 102.

The high-side and low-side switches $N_H$ and $N_L$ may be controlled, in use, by respective gate drive voltages $V_{GH}$ and $V_{GL}$. These gate drive voltages can be controlled to turn the switches $N_H$ and $N_L$ on and off in a controlled fashion to generate the output voltage $V_{OUT}$ at the output node 101. For instance, the high-side and low-side switches $N_H$ and $N_L$ may be switched in a generally complementary fashion with a controlled duty-cycle to generate the desired output voltage $V_{OUT}$ (on average over the course of one or more switching cycles) at the output node.

As will be well understood, for an enhancement-mode NMOS switch to be turned on, its gate-source voltage should be greater than a certain threshold voltage. Thus, to turn the NMOS switch on and have it remain on in use, the gate drive voltage should be higher than the voltage at the source terminal of the NMOS switch by an amount which is at least equal to the threshold voltage. For the low-side switch $N_L$ illustrated in FIG. 1, the source terminal is tied to the ground, i.e. the low-side voltage, and thus a voltage which is at least the threshold voltage above ground can be used to turn this switch on. However, for the high-side switch $N_H$, closing the high-side switch $N_H$ will connect the high-side voltage VDD to the output terminal 101. Thus, to completely close, i.e. to fully turn-on, the high-side switch $N_H$ the gate drive voltage $V_{GH}$ should be higher than VDD by at least the threshold voltage.

In at least some applications, there may thus be a need to generate a voltage higher than the high-side supply voltage for use as a gate drive voltage for the high-side switch. Voltage generation circuitry (not illustrated in FIG. 1), for example a charge pump circuit, may be provided to generate a suitable gate drive voltage $V_{GH}$ for the high-side switch $N_H$ for its on state. Such voltage generation circuitry will, however, add to overall circuit area and thus it is generally desirable that the voltage generation circuitry is as small as possible. This can, however, limit the charge transfer capability of the voltage generation circuitry, which in turn can limit how quickly the NMOS switch may be turned on, which can be disadvantageous for an output stage.

SUMMARY

Embodiments of the present disclosure relate to methods and apparatus for switching control, in particular for control of switching of MOS switches of an output stage or power stage or the like, which at least mitigate at least some of the above-mentioned issues.

According to an aspect of the disclosure there is provided a switching circuit comprising: a first semiconductor switch, wherein the first semiconductor switch comprises a composite semiconductor switch having a plurality of semiconductor switch elements, each semiconductor switch element having a respective gate electrode; and a switch driver configured to drive the gate electrodes of the plurality of semiconductor switch elements to a first gate voltage over a duration of a first switch transition of the first semiconductor switch. The switch driver is configured to enable drive of at least some of the gate electrodes of the plurality of semiconductor switch elements at different times in a temporal sequence during the first switch transition. The temporal sequence is configured to provide an average switch resistance for the first semiconductor switch over the duration of the first switch transition which is closer to a final switch resistance of the first semiconductor switch at the end of the first switch transition compared to driving the gate electrodes of the plurality of semiconductor switch elements at the same time as one another.

In some implementations, the first switch transition may be a turn on transition of the first semiconductor switch and the temporal sequence may be configured to provide a reduced average switch resistance for the first semiconductor switch over the duration of the first switch transition compared to driving the gate electrodes of the plurality of semiconductor switch elements at the same time as one another. The first semiconductor switch may be a composite NMOS switch and the plurality of semiconductor switch elements comprise NMOS switch elements.

In some examples, the switch driver may comprise a voltage generator for generating the first gate voltage. The temporal sequence may be based on a charge transfer capability of the voltage generator. There may be a controller for controlling the temporal sequence, and the controller may be configured to dynamically vary the temporal sequence in response to variation in charge transfer capability of the voltage generator. The voltage generator may comprise a switching voltage generator configured to repeatedly operable in cycles of switching phases. The temporal sequence may be based on the cycles of switching phases of the voltage generator. In some examples, the voltage generator may comprise a charge-pump.

In some examples, the switch driver may comprise a switch network for connecting the gate electrodes of the plurality of semiconductor switch elements to a gate drive signal and a controller configured to control said switch network during the first switch transition to implement said temporal sequence. The controller may be configured to dynamically control the temporal sequence based on one or more operating parameters. The one or more operating parameters may comprise a feedback signal indicative of a gate voltage of one of the plurality of semiconductor switch elements during the first switch transition. The controller may be configured to enable drive of a first one of the plurality of semiconductor switch elements and to determine when to subsequently enable drive of a second one of the plurality of semiconductor switch elements based on an indication of a gate voltage of the first one of the plurality of semiconductor switch elements.

In some implementations, the switch driver may be further configured to drive the gate electrodes of the plurality of semiconductor switch elements to a second gate voltage during a second switch transition of the first semiconductor switch, wherein the second switch transition is an opposite transition to the first switch transition. The switch driver may be configured to enable drive of all of the gate electrodes of the plurality of semiconductor switch elements at the same time during the second switch transition. The second switch transition may be a turn off transition of the first semiconductor switch. In some examples, the first semiconductor switch may be a high-side switch connected between a high-side voltage node and an output node and the switching circuit may also comprise a second semiconductor switch which is a low-side switch connected between a high-side voltage node and the output node.

The switching circuit may be implemented as part of a power regulator or switching driver.

In another aspect there is provided a switching circuit comprising: a composite semiconductor switch having a plurality of semiconductor switch elements, each semiconductor switch element having a respective gate electrode; and a switch driver configured to connect the gate electrodes of the plurality of semiconductor switch elements to a gate drive signal during a first switch transition of the first semiconductor switch. The switch driver is configured to connect at least some of the gate electrodes of the plurality of semiconductor switch elements to the gate drive signal at different times in a temporal sequence to provide an accelerated change in switch resistance compared to connecting the gate electrodes of the plurality of semiconductor switch elements to the gate drive signal at the same time as one another.

In another aspect there is provided a switching circuit comprising: a composite semiconductor switch having a plurality of semiconductor switch elements, each semiconductor switch element having a respective gate electrode; and a switch driver configured to receive a gate drive signal from a gate drive supply. The switch driver is configured to connect the gate electrodes of the plurality of semiconductor switch elements to the gate drive signal during a first switch transition of the first semiconductor switch, and is configured to control connection of the gate drive signal to the gate electrodes during said first switch transition in a temporal sequence based on a characteristic of the gate drive supply.

In some examples, the connection of the gate drive signal to the gate electrodes in the temporal sequence may be controlled to accelerate a change in resistance of the composite MOS switch based on the characteristic of the gate drive supply compared to connecting the gate drive signal to the gate electrodes of the plurality of semiconductor switch elements at the same time as one another. The characteristic of the gate drive supply may comprise one or more of: an instantaneous charge available from the gate drive supply, a current limit of the gate drive supply, a state of health or a state of charge of a battery of the gate drive supply.

It should be noted that, unless expressly indicated to the contrary herein or otherwise clearly incompatible, then any feature described herein may be implemented in combination with any one or more other described features.

BRIEF DESCRIPTION OF THE DRAWINGS

For a better understanding of examples of the present disclosure, and to show more clearly how the examples may be carried into effect, reference will now be made, by way of example only, to the following drawings in which:

FIG. 3 illustrates variation of gate voltage over time during a turn on transition of the high-side switch;

FIG. 4a illustrates an example of a single MOS switch and FIGS. 4b and 4c illustrate examples of composite MOS switches;

FIG. 8 illustrates how switch resistance for a composite switch may vary with the proportion of the composite switch initially driven to be turned on.

DETAILED DESCRIPTION

The description below sets forth example embodiments according to this disclosure. Further example embodiments and implementations will be apparent to those having ordinary skill in the art. Further, those having ordinary skill in the art will recognize that various equivalent techniques may be applied in lieu of, or in conjunction with, the embodiments discussed below, and all such equivalents should be deemed as being encompassed by the present disclosure.

As described above, in some applications the gate drive for a MOS device, such as a gate drive voltage for ensuring that an NMOS switch is on, may be provided in a manner where the charge transfer capability of the gate drive is finite or limited, e.g. the gate drive is provided by a voltage generator with a limited charge transfer capability.

Figures 1, 2:
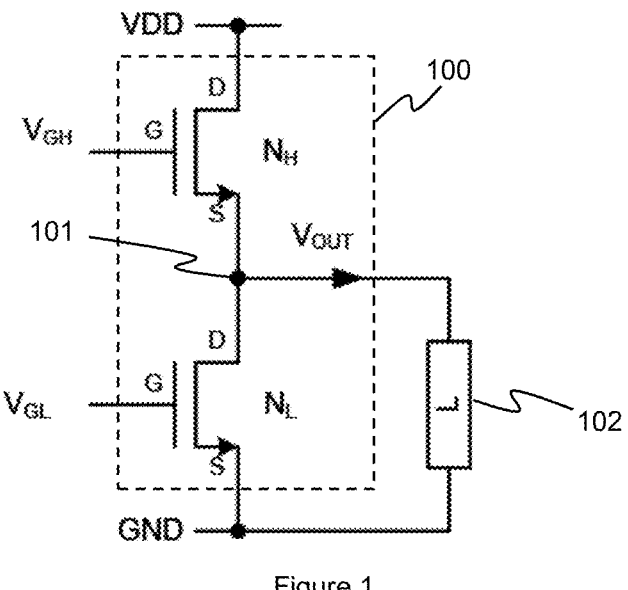
FIG. 1 illustrates one example of an output stage with two NMOS switches.
FIG. 2 illustrates one example of conventional switching control of an output stage.

For example, FIG. 2 illustrates an example of a switching circuit 200 having an output stage 100 with high-side and low-side enhancement-mode NMOS switches $N_H$ and $N_L$ such as discussed with reference to FIG. 1 and a switch driver 201 for controlling switching of the high-side and low-side switches $N_H$ and $N_L$ of the output stage 100. The switch driver 201 comprises a switch network 202 which, in this example, comprises four switches, S1L, S2L, S1H and S2H which can be controlled to control the gate drive voltages $V_{GH}$ and $V_{GL}$ of the high-side and low-side switches $N_H$ and $N_L$.

Switch S1L selectively couples the gate of the low-side switch $N_L$ to its source terminal, which in this example is connected to ground. When switch S1L is closed/on (with switch S2L open/off) the gate-source voltage of the low-side switch $N_L$ is substantially zero and the low-side-switch is off. Switch S2L selectively couples the gate of the low-side switch $N_L$ to a voltage $V_G$ which is higher than ground by an amount which is at least equal to the threshold voltage. When switch S2L is closed/off (with switch S1L open/on) the gate-source voltage of the low-side switch $N_L$ is greater than the threshold voltage and the low-side switch $N_L$ is on.

Similarly, S1H selectively couples the gate of the high-side switch $N_H$ to its source. When switch S1H is closed (with switch S2H open) the gate-source voltage of the high-side switch $N_H$ is substantially zero and the high-side-switch is off. Switch S2H selectively couples the gate of the high-side switch $N_H$ to the output of a voltage generator, which in this example is a charge pump 203. The charge pump 203 operates to generate a voltage which is higher than the voltage at the source of the high-side switch $N_H$ by an amount which is greater than the threshold voltage, such that when switch S2H is closed (with switch S1H open) the gate-source voltage of the high-side switch $N_H$ is greater than the threshold voltage and the high-side-switch is on.

The switches of the switch network 202 are controlled by a controller 204 so as to control turn on and turn off of the high-side and low-side switches $N_H$ and $N_L$ (with a short dead time between turn off of one switch and turn on of the other to avoid current shoot through) to generate the output voltage $V_{OUT}$, e.g. based on some input data signal depending on the application. The controller 204 thus defines the switching period and duty-cycles of the switches of the output stage 101. In some applications the duty-cycle could be substantially pre-defined, in which case the input data could be some timing signal (or there may not be a need for any data input). However, in other applications the controller 204 may be implemented as at least part of a modulator for providing a controllably variable duty-cycle for the switches of the output stage 101 so as to control the output voltage $V_{OUT}$. One skilled in the art will be well aware of various ways in which the controller 204 could be implemented to control the duty-cycle of switching of the output stage 101. In any event, it will be understood that the switch control signals generated by the controller 204 for controlling the switches $N_H$ and $N_L$ are at a significantly lower frequency than the clock signals generated by the clock generator 205, i.e. there will be multiple cycles of the clock generator 205 between a signal transition in the switch control signals generated by the controller 204.

The charge pump 203, in this example, comprises a flying capacitor $C_P$ and four switches S1 to S4. The charge pump operates in two phases, φ1 and φ2, as controlled by clock signals from clock generator 205. In a first phase, φ1, switches S2 and S1 are closed (with switches S4 and S3 open) to connect nodes A and B of the flying capacitor $C_P$ to the voltages $V_G$ and ground respectively, so as to charge it to a voltage substantially equal to $V_G$. In the second phase φ2, switches S3 and S4 are closed (with switches S2 and S1 open) so as to connect node B of the flying capacitor $C_P$ to the source voltage of the high-side switch $N_H$ and to connect node A of the flying capacitor $C_P$ to the output 203a of the charge pump 203. In the absence of any loading of the charge pump output, the voltage at the output 203a of the charge pump 203 would, during the second phase φ2, be driven to a voltage which is $V_G$ higher than the source voltage of the high-side switch.

The charge pump 203 can thus be operated to generate a gate drive voltage for turn on of the high-side switch $N_H$. When switch S2H of the switch network 202 is closed (with S1H open), the operation of the charge pump 203 can drive the gate voltage of the high-side switch $N_H$ to a voltage which is $V_G$ higher than the voltage at its source terminal and thus can turn on the high-side switch $N_H$ and keep it on. However, the charge transfer capability of the charge pump 203 may be somewhat limited, which means that it can take some time for the high-side switch to fully turn on during a turn-on transition.

As will be understood by one skilled in the art, there will be an inherent gate capacitance $C_{GS}$ associated with the high-side switch $N_H$ and increasing the gate voltage of the switch requires charging of this gate capacitance. The rate of charging of this gate capacitance during the turn-on transition of the high-side switch $N_H$ has a dependence on the capacitance of the flying capacitor $C_P$.

FIG. 3 illustrates a plot of voltage against time showing an example of how the gate-source voltage of the high-side NMOS switch $N_H$ may vary over time during a turn-on transition of the high-side switch, i.e. with switch S2H closed (S1H open) and the charge pump 203 operated to raise the gate voltage of the gate terminal of the high-side NMOS switch $N_H$.

Time t1 represents the time of a first cycle of operation of the charge pump 203 with switch S2H closed, i.e. a cycle of the two phases φ1 and φ2, with time t2 representing a second cycle, t3 a third cycle and so on. The relevant time, for this idealised plot, can be seen as the time of the start of phase φ2 of the relevant cycle, where the charged flying capacitor $C_P$ is coupled to the output of the charge pump and hence effectively connected in parallel with the gate capacitance in a charge sharing phase (note the plot of FIG. 3 assumes instantaneous charge transfer and ignores any transients for clarity).

It can be seen that the gate-source voltage increases from a starting voltage level V1 (before the start of the turn on transition) to a voltage level V2 during the first charge pump cycle, to a voltage level V3 during the second charge pump cycle and so on until eventually the voltage $V_{GH}$ is reached at a time tN. As will be understood by one skilled in art, the increase in the gate-source voltage is nonlinear with respect to time. During the phase φ2 of the charge pump cycle, charge will be transferred from the flying capacitor $C_P$ (thus reducing the voltage of the flying capacitor $C_P$) to the gate capacitance $C_{GS}$ (thus increasing the gate-source voltage) until the flying capacitor voltage and gate-source voltage of high-side NMOS switch $N_H$ are equal, and the amount of charge transferred each cycle will depend on the relative capacitances values and also the voltage difference between the flying capacitor and the gate capacitance at the start of phase φ2 (which will be lower for each subsequent cycle as the voltage of the gate capacitance increases).

In the example of FIG. 3, the gate voltage remains below the threshold voltage $V_{TH}$ until the time t3, where the gate voltage reaches the voltage level V4. The switch only reaches a low resistance on state once the gate voltage reaches the threshold voltage, which in this example thus occurs in the third charge pump cycle, and then requires a few more charge pump cycles to reach a minimum resistance value. This effective delay in turn on of the high-side switch can be disadvantageous as the relatively high resistance of the switch during turn on results in power losses of the output stage and reduces efficiency and/or in some cases can result in distortion of the desired output voltage waveform.

The speed of turn on of the high-side switch could be made faster by increasing the charge transfer capability of the charge pump 203, for instance by increasing the capacitance of the flying capacitor $C_P$, so that a greater amount of charge can be transferred each cycle. However, it is generally preferred for the capacitor of the charge pump to be formed as part of an integrated circuit with the charge pump and providing a larger capacitance for the flying capacitor $C_P$ of charge pump will generally require a larger circuit area for the capacitor. As noted above it is desirable to minimise circuit area. Another option could be to provide a reservoir capacitor at the output of the charge pump, but this would again require additional circuit area.

Note that in at least some examples, the turn on of the low side switch $N_L$ may not suffer from the same problems because the drive strength for the gate drive for the low-side switch may not be limited in the same way. The voltage $V_G$ can be directly connected to the gate of the low-side switch for turn on of the low-side switch, and the voltage $V_G$, which can be lower than VDD, may be derived from VDD without any significant limitation in charge transfer. However, it will be appreciated that, were the gate drive to the low-side switch to have a limited charge transfer capability in a particular application, then similar issues regarding the rate of turn on could apply for the low-side switch.

To mitigate these issues, embodiments of the present disclosure provide a composite semiconductor switch which is formed from a plurality of semiconductor switch elements, especially a plurality of MOS switch elements, configured so as to provide desired switch characteristics, e.g. on-resistance, for the overall composite switch when all of the switch elements are on. The switch elements are driven separately in a temporally sequenced manner during a switch transition so as to use the available gate drive strength to implement the switch transition in an efficient way. For instance, for turn on of a composite switch formed from a plurality of NMOS switch elements, the NMOS switch elements may be controlled in a sequenced manner to substantially minimise the average switch resistance during the transition, that is to ensure that the total switch resistance during the switch transition, i.e. the average of the switch resistance over the course of the transition, is as low as possible.

In effect a switch, such as the high-side switch $N_H$ discussed with reference to FIGS. 1 and 2, can be thought of as being split or subdivided into two or more smaller switch elements. Each of these component switch elements could be seen as a smaller NMOS switch, but collectively they can provide substantially the same overall switch characteristic as the single larger switch, e.g. substantially the same overall minimum on-resistance and current capability. A smaller switch can have a smaller gate capacitance than a larger switch, which can thus be charged more quickly for a given drive strength, i.e. for a given charge transfer capability. This means that a smaller switch element can be turned on more quickly.

There are various ways the switch elements may be configured to provide the composite switch having desired switch characteristics, i.e. how a switch may, in effect, be split into separate component switch elements, as would be understood by one skilled in the art.

For example, FIG. 4a illustrates a single (non-split or non-composite) NMOS switch having a gate electrode with a gate width W and a gate length L. FIG. 4b illustrates an equivalent composite NMOS switch comprising two NMOS switch elements having respective gate widths Wa and Wb and each having a gate length L, where Wa+Wb equals W. The composite switch of FIG. 4b thus provides substantially the same overall switch characteristics as the single switch of FIG. 4a, but allows for separate control of the gate electrodes of the component switch elements. This can be extended to any desired number of parallel switch elements, as illustrated in FIG. 4c which illustrates a composite NMOS switch comprising 'n' NMOS switch elements having respective gate widths Wa, Wb . . . Wn and each having a gate length L, where the sum of the gate widths Wa to Wn equals W. Note it should be understood that the composite switch may be implemented with a divided gate terminal, to provide separate gate terminal arranged with respect to common source and drain terminals, e.g. two separate gate electrodes having respective gate widths Wa and Wb that sum together to equal W, so that part of the composite switch may be controlled by driving one gate electrode or the whole switch can be controlled by driving both gate electrodes. The concept of splitting the gate electrode of an NMOS switch is substantially equivalent to the concept of splitting the size (W/L) of the NMOS switch as illustrated in FIGS. 4b and 4c and in each case the composite switch is provided by the collection of individual switch elements. All of these examples discussed with reference to FIGS. 4a to 4c would provide substantially the same overall switch characteristics, i.e. minimum on-resistance and current handling capability (when all switch elements are on), but the examples of FIGS. 4b and 4c allow for sequenced driving of the switch elements for a more efficient switch transition.

Figures 5, 6:
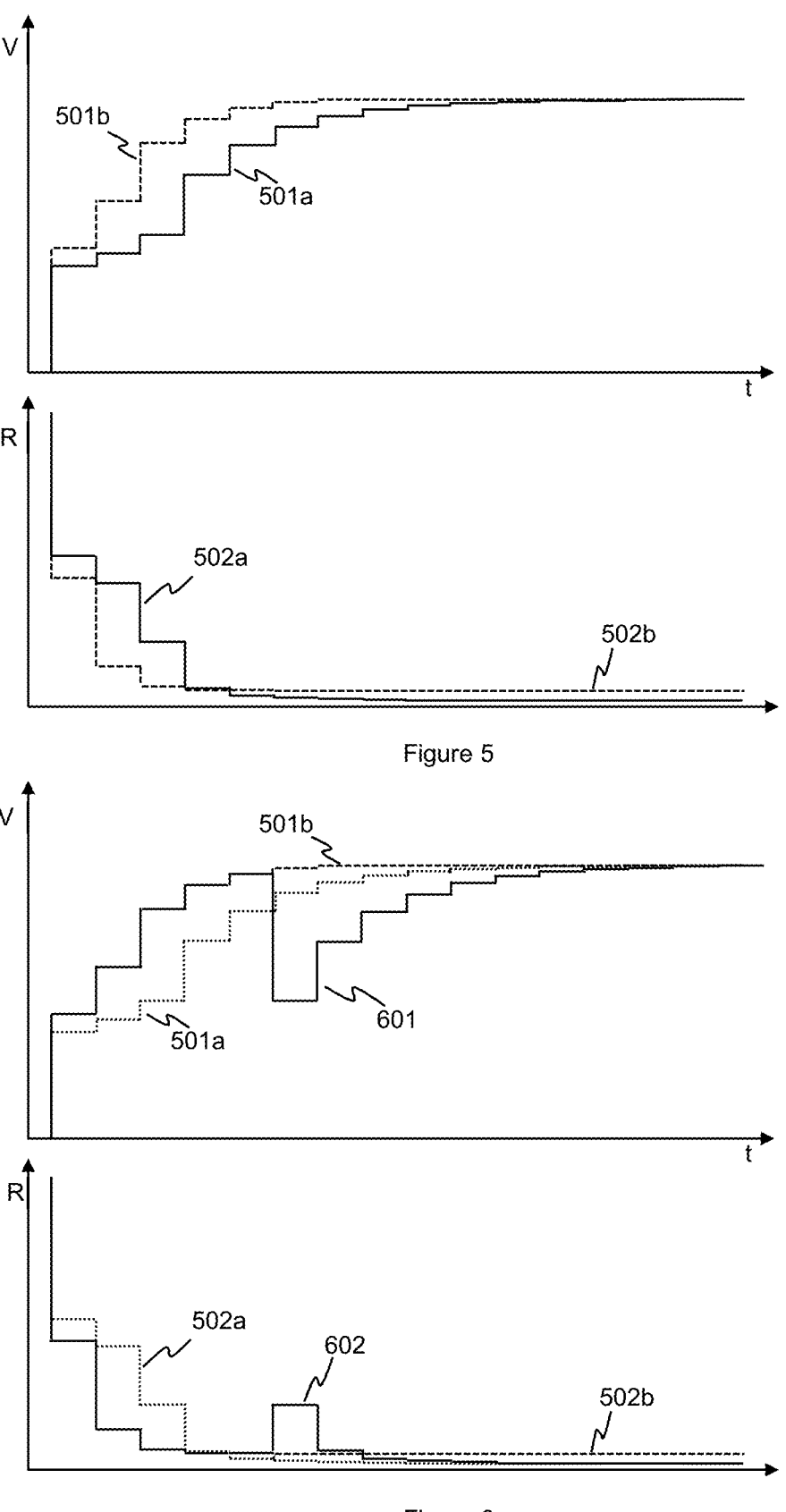
FIG. 5 illustrates variation of gate voltage and switch resistance over time for MOS switches of different sizes.
FIG. 6 illustrates plots of gate voltage and switch resistance over time for a composite MOS switch with temporally sequenced drive of the gates of the switch components.

FIG. 5 illustrates how the gate-source voltage (top plot) and switch resistance (lower plot) of two NMOS switches of different sizes varies with time, when driven by a charge pump with a finite charge transfer capability, such as discussed above with reference to FIGS. 2 and 3. Traces 501a and 502a (solid lines) illustrate, respectively, how the gate-source voltage and switch resistance (drain-source resistance) vary for a first switch of a first size (omitting any transients for clarity). Traces 501b and 502b (dashed lines) likewise illustrate, respectively, how the gate-source voltage and switch resistance vary for a second switch when driven by the same charge pump, where the second switch is half the size of the first switch and has a gate capacitance which is half that of the first switch.

It can be seen that the gate-source voltage of the first switch increases over time, but the resistance of the switch, i.e. the drain-source resistance, remains relatively high for several cycles of operation of the charge pump, i.e. until the gate-source voltage is higher than the threshold voltage (not illustrated). For the second switch, given the same charge transfer capability of the charge pump, the gate-source voltage increases much quicker over the first few cycles of charge pump operation and the second switch reaches a lower resistance state much quicker. However, the final on-resistance of the second switch is larger than that of the first switch due to its smaller size, and in this example may be double that of the first switch.

Reducing the size of the relevant switch, e.g. the high-side switch $N_H$ discussed with reference to FIG. 2, would thus allow the switch to be turned on faster by a voltage generator with a limited charge transfer capability, but the final on-resistance would be greater. However, by effectively sub-dividing a desired size of switch into two more smaller component switch elements, and just driving the gate of a first one of the switch elements at the start of the transition, the limited charge transfer capability may be used to quickly turn on the first switch element, to provide a lower switch resistance than would be achievable by driving the gates of all the switch elements (or a single switch of equivalent size to the combined switch elements). Subsequently, at an appropriate point, driving of the gate of a second switch element is enabled, so that that second switch element also turns on quickly at that point. Similar sequencing can be applied for other switch elements if there are more than two switch elements. This sequencing of the gate drive of the switch elements can be more efficient, in terms of minimising the average switch resistance over a defined period of the transition, than driving a single switch of equivalent size to the composite switch.

FIG. 6 illustrates this principle and illustrates how a composite switch formed of two NMOS switch elements of equal size may be controlled to minimize the average on-resistance during the turn on transition. FIG. 6 shows again the traces 501a and 501b (as dotted lines in this figure) of gate-source voltage and switch resistance for the first switch previously discussed with respect to FIG. 5 and traces 501b and 502b (dashed lines) for the second switch previously discussed with respect to FIG. 5. The composite switch in this example is formed by first and second switch elements such as illustrated in FIG. 4b, where the first and second switch elements are of equal size and each the same size as the second switch. The composite switch is thus of equivalent size to the first switch.

Trace 601 (solid line) shows the gate-source voltage of the active switch elements during the turn on transition, i.e. those switch elements that are enabled to be driven. In this example, only the first switch element is driven by the charge pump for the first five charge pump cycles. As this switch element is effectively the size of the second switch, the gate-source voltage and switch resistance essentially follow the traces 501b and 502b for a single switch of that size. After the fifth charge pump cycle, driving of the second switch element is enabled, and the gates of the two switch elements are connected together. At this point charge sharing occurs between the two gate capacitances with a consequent drop in the gate-source voltage level. However, the resultant voltage level may be greater than the threshold voltage and thus the first switch element may remain mainly on, whilst the second switch element also turns on. The overall switch resistance of the composite switch may, as illustrated, increase at that point, but will reduce in further charge pump cycles and the final on-resistance of the composite switch is substantially the same as that of the first switch of equivalent size. It can be seen that the overall switch resistance of the composite switch over the course of the switch transition, i.e. the average or integral of the switch resistance of trace 602 over the transition period, is lower than that illustrated by trace 502a for the first switch of equivalent size to the combined switch.

Therefore, by implementing a composite switch with at least first and second MOS switch elements, where the gate of the first switch element can be selectively driven separately from that of the second switch element, and by temporally sequencing the driving of the gates of the first and second switch elements, a more optimized switch transition can be achieved than would be the case for driving a single switch of equivalent size (or driving all the switch elements of the composite switch at the same time). That is, for a turn on transition of the composite switch, in which the composite switch transitions from an off-state (high resistance) to an on-state (low resistance), the average switch resistance of the composite switch over the course of the transition can be lower, i.e. closer to the final switch resistance value at the end of the switch transition, than would be the case for driving a single switch of equivalent size (or driving all the switch elements of the composite switch at the same time). The temporal sequencing effectively accelerates the rate of change of switch resistance during a switch transition, in that, during an initial part of the switch transition, i.e. in an initial part of the transition from off to on or vice versa for a turn off transition, the switch resistance of the composite switch changes more quickly from the starting value than would be the case. This acceleration of the change in switch resistance can thus result in the resistance of the composite switch more quickly getting closer to the final resistance value at the end of the transition and can thus provide an average switch resistance over the duration of the switch transition that is closer to the desired final value than otherwise would be the case.

In this example, only the gate of the first switch element is driven initially. Whilst the example of FIG. 6 discusses two switch elements of equal size, in some applications some other ratio of relevant sizes may provide a better efficiency with appropriate sequencing. This principle could be extended to more than two component switch elements, but at the expense of slightly increased complexity. Different sequencing of the turn on of the switch elements could also be implemented for different applications and/or based on operating conditions.

Figure 7:
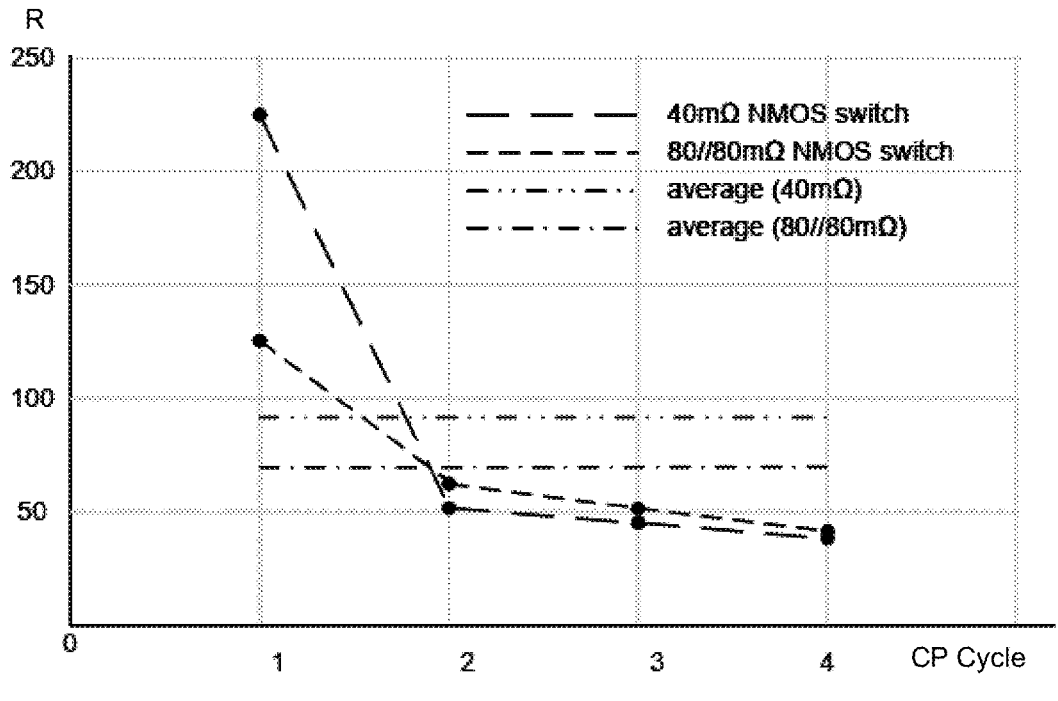
FIG. 7 illustrates a comparison of switch resistance over time over several charge pump cycles of a charge pump providing a gate drive voltage for a single switch and a composite switch.

For instance, FIG. 7 illustrates a comparison of variation of switch resistance with charge pump cycle for an example of a single switch (with an assumed minimum on-resistance of 40 mΩ) and a composite switch formed by two switch elements of equal size to one another (each with an assumed minimum on-resistance of 80 mΩ).

In this example, the gate of just one switch element of the combined switch is driven in the first charge pump cycle, but the gates of both switch elements are driven from the second charge pump cycle onward. It can be seen that, in this example, just driving the gate of one switch element for the first charge pump cycle results in a significantly lower switch resistance than would be the case for an equivalent non-split, i.e. non-composite switch. In this example, as both gates are driven from the second charge pump cycle onwards, the resistance of the composite switch at this point is slightly greater than would be the case for the equivalent non-split switch, but the average switch resistance over the illustrated cycles is lower for the composite switch. Therefore, splitting the NMOS switch, and hence the parasitic gate capacitance, and temporally sequencing the drive of the gate electrodes of the switch elements results in the composite NMOS switch operating with a lower resistance during the switch transition, so closer to the final switch resistance at the end of the switch transition, which can reduce, minimize or, in some cases, eliminate system level issues such as efficiency loss and/or distortion.

Figure 8:
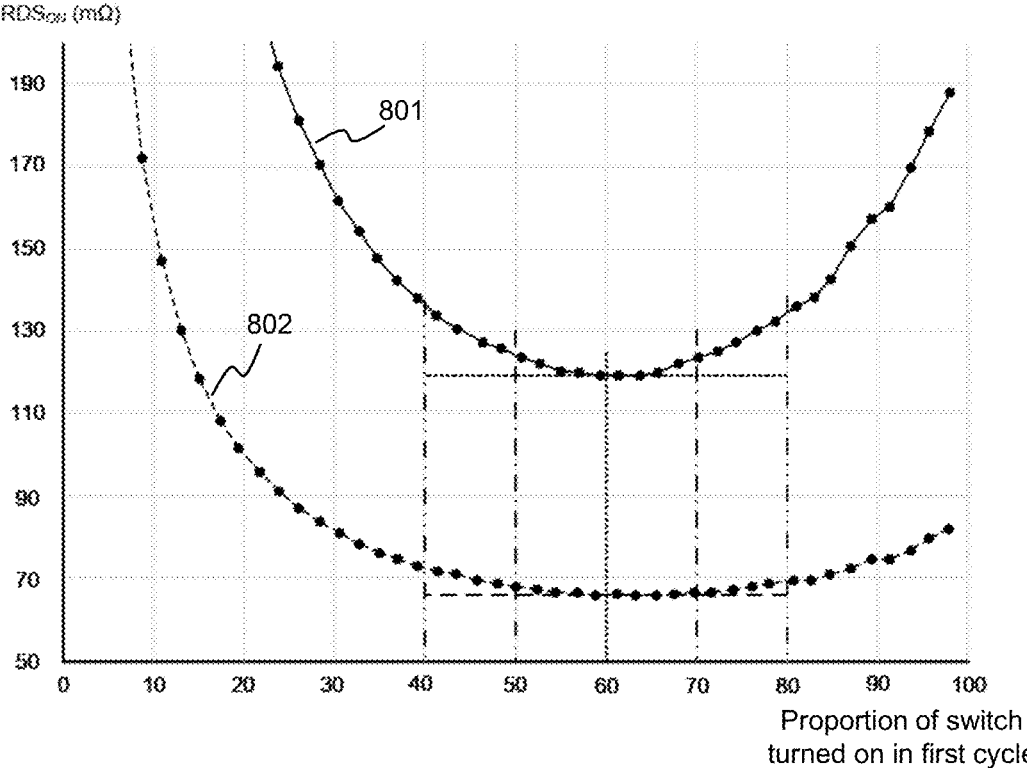

As noted above, the ratio of the size of the switch elements forming the composite switch, i.e. the way that the switch is divided, may be selected for a particular application. FIG. 8 illustrates an example of NMOS switch resistance over a plurality of charge pump clock cycles versus the proportion of the composite NMOS switch which is initially driven to be turned on in the first charge pump clock cycle, that is, the size of the switch element whose gate drive is enabled at the start of the switch transition as a portion of the overall size of the composite switch, assuming that in all cases the overall size of the whole composite switch is the same and assuming a given charge transfer capability for the gate drive.

Referring to FIG. 8, the upper curve 801 represents the switch resistance of the NMOS switch after the first charge pump clock cycle, as a function of the proportion of the composite switch which is driven to be turned on in the first charge pump cycle. The lower curve 802 represents the average resistance of the NMOS switch measured over a plurality (N), for example four, of charge pump clock cycles, of the whole switch. It can be seen from FIG. 8 that, considering the NMOS switch, there may be, for a given application, an optimum split value or an optimum range of split values for splitting of the switch width/gate size that is initially charged. For instance, as illustrated by the vertical dashed lines a beneficial value of splitting may be between approximately 40-80% inclusive or between 50-70% inclusive or between 60-70% inclusive. In some cases the proportion of the overall switch width or overall gate size which is charged in the first cycle may be at or around 65% or at or around 60%.

It will be understood that the overall width of all the split switch elements and/or the overall gate size, i.e. the characteristics of the composite switch, may be determined for a particular application based on parameters such as the maximum expected current etc. and the division ratio for the split switches and/or split gates, i.e. the size of the individual component switch elements set accordingly.

Figure 9:
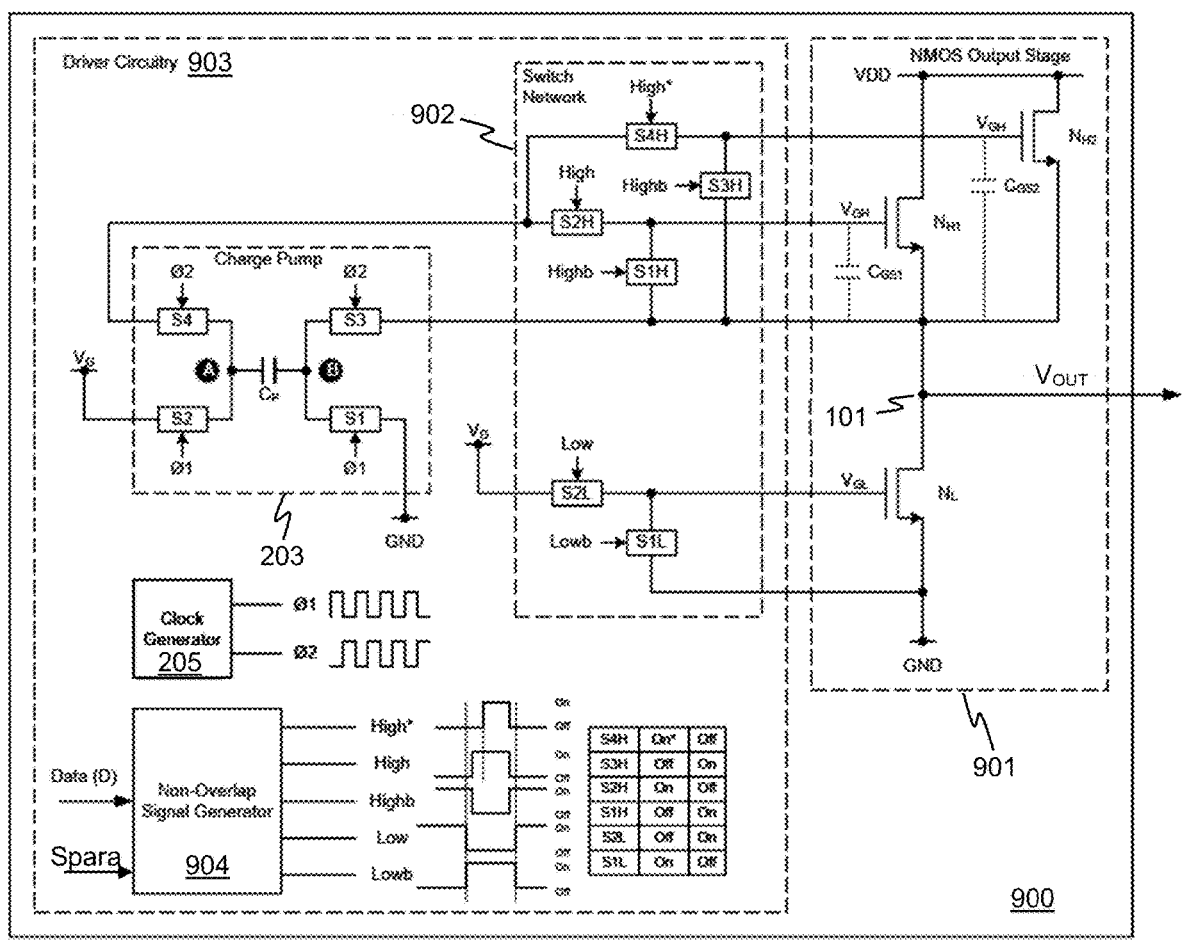
FIG. 9 illustrates an example of switching control of an output stage according to an embodiment.

FIG. 9 illustrates an example of an apparatus 900 including a composite NMOS switch formed from a plurality of switch elements according to an embodiment. FIG. 9 illustrates an example of a switching circuit similar to that discussed with reference to FIG. 2, and in which similar components are identified by the same reference numerals. The switching circuit 900 includes an output or power stage 901 which comprises a high-side switch and a low-side switch connected in series between the high-side voltage and low-side voltage, which in this example are VDD and ground respectively, with an output node 101 at the midpoint connection. The low-side switch $N_L$ may be implemented by a single NMOS device as discussed with reference to FIG. 2. However, the high-side switch is a composite or split-switch comprising first and second NMOS switch elements $N_{H1}$ and $N_{H2}$.

A switch driver 903 has a switch network 902 configured to control the gate drive voltages of the low-side switch and also of the switch elements of the high-side switch. Switches S1L and S2L may selectively connect the gate of the low-side switch $N_L$ to its source terminal of the voltage $V_G$ as discussed with reference to FIG. 2, which may provide a relatively large or unlimited charge transfer capability for the low-side switch. Switches S1H and S2H may be provided to selectively control the gate voltage of the first switch element $N_{H1}$ of the high-side switch and switches S3H and S4H are provided to control the gate voltage of the second switch element, with switch S3H selectively connecting the gate of the second switch element to its source and switch S4H selectively connecting the gate of the second switch element $N_{H2}$ to the charge pump 203. The charge pump 203 may have the same structure as discussed with reference to FIG. 2 and may be clocked by clock generator 205 and thus may provide a limited charge transfer capability.

In use, when the high-side switch is off, both switches S1H and S3H may be closed (with switches S2H and S4H open) so that the gate-source voltage for both of the first and second switch elements $N_{H1}$ and $N_{H2}$ is zero and both switch elements are off. For turn on of the high-side switch, controller 904 may be configured to open switch S1H and close switch S2H to connect the gate of the first switch element $N_{H1}$ of the high-side switch to the output of charge pump. Switch S3H may also be opened at the same, however, switch S4H is initially left open so that the charge pump 203 initially only provides charge to the first switch element $N_{H1}$ of the composite high-side switch. At an appropriate point switch S4H can be closed to also connect the gate of the second switch element $N_{H2}$ to the output of the charge pump 203, which connects the gate of the first and second switch elements to one another.

The timing of the switching of switch S4H can be controlled by the controller 904. In some implementations the timing of switching of switch S4H, to enable the second switch element $N_{H2}$ during the turn on transition of the high-side switch, may be predetermined and the controller 904 may thus turn on switch S4H after a predetermined delay from turning on switch S2H, e.g. after a certain number of charge pump cycles, which could be determined for instance by monitoring the clock signals generated by the clock generator 205.

The delay between enabling drive of the first switch element $N_{H1}$ at the start of the transition and subsequently enabling drive of the second switch element $N_{H2}$, i.e. the temporal sequencing of the switch elements, can be determined based on the charge transfer capability of the voltage generator to provide an optimally low average switch resistance during the switch transition for expected operating conditions. For instance, based on an expected or worst-case charge transfer capability of the charge pump 203 and relevant gate capacitances of the switch elements, the timing sequence that leads to an optimal turn on transition may be determined and used to control switching of switches S2H and S4H during the turn on transition. The optimal timing of the turn on of the separate switch elements for a particular application could readily be determined by modelling/simulation and/or testing. The temporal sequence may thus be based on the cycles of switching phases of the voltage generator.

In some applications, however, the temporal sequencing of drive of the various switch elements of the high-side switch, e.g. the delay between turning on switch S2H to start charging the gate of the first switch element $N_{H1}$ and turning on switch S4H to enable the charging of the gate of the second switch element $N_{H2}$, may be dynamically controlled.

For instance, the controller may be configured to dynamically vary the temporal sequence in response to variation in charge transfer capability of the voltage generator. The temporal sequence may, in some embodiments, be controllably varied in use based on one or more operating parameters and the controller 904 may receive a signal Spara indicative of such operating parameters. For instance, the controller 904 may be configured to receive a feedback signal indicative of the gate voltage of the first switch element and may be configured to turn on switch S4H to enable the second switch element $N_{H2}$ based on such a feedback signal, for instance when the gate voltage reaches a defined threshold level. The controller 904 thus responds to how quickly the charge pump raises the gate voltage of the first switch element to a sufficient level for enabling the second switch element. Additionally or alternatively the controller 904 may be configured to also receive indication of other relevant system parameters, for instance such as an indication of the high-side voltage VDD and/or an indication of the voltage of the flying capacitor $C_P$, or some other indication of the charge transfer capability of the charge pump 203 and/or an indication of some parameters that may impact on the resistance of the switch elements. The controller 904 may thus be configured to receive indications of the monitored parameters as the signal Spara and select or determine an appropriate timing sequence for enabling drive of the gates of the switch elements, for instance by selecting between different timing sequences as stored in a look-up table or the like based on the relevant parameters.

The gates of the first and second switch elements $N_{H1}$ and $N_{H2}$ may thus be enabled and driven in a sequenced manner during the turn on transition of the composite high-side switch. After the transition, both the first and second switch elements $N_{H1}$ and $N_{H2}$ will be fully on and the composite high-side switch is fully on. The controller 904 will maintain the composite high-side switch in the on state for the desired period, e.g. to provide a desired duty-cycle based on some input data, and will then turn the composite high-side switch off.

For turn off of the composite high-side switch, the gate voltage for each of the first and second switch elements $N_{H1}$ and $N_{H2}$ is driven low and thus the relevant gate capacitance needs to be discharged. In the example of FIG. 9 the composite high-side switch may be turned off by opening switches S2H and S4H and closing switches S1H and S3H. Closing switches S1H and S3H effectively short-circuits the gate capacitances of the first and second high-side switch elements $N_{H1}$ and $N_{H2}$ respectively, which can result in rapid discharging of the gate capacitance. As this discharging of the gate capacitances is not typically constrained by any limit of charge transfer capability, switches S1H and S3H may be closed at the same time at the start of the turn off transition so as to turn both the first and second switch elements $N_{H1}$ and $N_{H2}$ off as quickly as possible.

Embodiments of the present disclosure thus make use of a composite semiconductor switch, such as a composite MOS switch, formed from a plurality of switch elements, where a gate electrode (or equivalent) of at least a first semiconductor switch element can be driven separately or independently to the gate electrode of at least a second switch element. In embodiments of the disclosure, the gate electrodes of at least the first and second switch elements are driven at different times in a temporal sequence during a first switch transition (e.g. a turn on transition) of the composite switch so as to improve the switch transition, e.g. in terms of optimising the average or total switch resistance during the switch transition to be closer to the final value of switch resistance. In other words, the sequencing of the gate electrodes is configured to provide a greater average change, over the course of the switch transition, of the switch resistance of the semiconductor switch from a starting value, compared to driving the gate electrodes at the same time as one another. For a turn on transition of a composite NMOS switch, the various NMOS switch elements are driven in a sequence to reduce the average switch resistance over a defined period of the transition, which can be seen as effectively speeding up how quickly the switch gets to a low resistance state.

It should be noted that composite switches have been proposed in other applications to allow the proportion of the composite switch which is turned on to be controllably varied, e.g. to provide a variable size of switch. In such a case, however, an individual switch element may be selectively turned on or not, i.e. during a turn on switch transition only some of the switch elements may be enabled and the selected switch elements would then all be driven at the same time as one another. Embodiments of the present invention are not concerned with enabling a selectively variable switch size and may be implemented so that all switch elements are turned on as part of a turn on transition. However in embodiments of the present disclosure, temporal sequencing is applied to when the switch elements are enabled during the transition.

It will also be noted that a composite switch could, in other applications, be controlled to provide some control over the slew-rate of an output signal. In some applications it may be desirable to limit the slew-rate of an output signal, for instance to reduce problems of EMI (electromagnetic interference) or emissions. One way to control the slew-rate of a signal generated by a switch could be to use a composite switch and to control turn on of the various switch segments so as to effectively limit the rate of the switch transition to maintain the slew-rate of the output signal within a defined limit. In such a case the control of the switch elements may be based on an indication of the output signal and the charge transfer capability of the gate drive is not a limiting factor in the speed of the switch transition. By contrast, embodiments of the present disclosure are configured to control the sequencing of the switch elements to accelerate the switch transition in the case where the charge transfer capability of the available gate drive is limited. Embodiments of the present disclosure thus uses the limited charge transfer capability of the gate drive in the most effective way possible and, for a turn on transition, the sequencing of the switch elements may be controlled to essentially ensure the switch turns on as fast as possible given the available charge transfer.

In general, some embodiments of the disclosure relate to apparatus and/or methods for driving an output stage having a transistor switch, which may comprise an NMOS transistor, which may be a high-side transistor switch connected between an output node and a high-side voltage node. The output stage may further comprise a low-side transistor switch, which may be an NMOS transistor, connected between the output node and a low-side voltage node. A voltage generator may be configured to generate a first voltage which can be applied to a gate terminal of the high-side transistor switch to turn the high-side transistor switch on. The first voltage may be greater than a voltage at the output node by an amount which is at least equal to a threshold voltage for the high-side transistor switch. The voltage generator may be a flying capacitor-based voltage generator, such as a charge pump, which is operable in a series of phases which includes an output phase and a flying-capacitor charging phase. Such a voltage generator may generate the first voltage to be able to provide charge to the gate of the high-side transistor in the output phase, but not the flying-capacitor charging phase. In embodiments of the present disclosure the high-side transistor switch may be configured to have at least two gate terminals which can be independently charged so as to control conduction via a part of the switch. In some embodiments the high-side switch may comprise first and second switch components in parallel, each with a separate gate terminal. In some embodiments the high-side switch may comprise a transistor switch with a sub-divided gate terminal comprising at least two gate terminal components that can be independently driven to control conduction via the switch. In either case the high-side switch can be seen as a composite switch formed from a plurality of switch elements. During at least one switch transition, e.g. a switch turn-on transition, the voltage generator may be initially connected to one or more, but not all, of the separate gate terminals of the composite high side switch, for instance to just one of the gate terminals of the parallel switches or just one gate terminal component of a split gate switch. In this way only that gate capacitance is initially charged. The other gate terminal(s) may be connected, possibly in sequence, after one or more cycles of operation of the voltage generator.

The examples above have been discussed in the context of a charge pump with a limited charge transfer capability. However, as will be understood by one skilled in the art, other types of voltage generator may also suffer from a limited charge transfer capability, which can negatively impact how quickly a switch transition may be implemented. Embodiments of the present disclosure may advantageously be implemented in any application when a gate drive signal is generated by any type of voltage generator with a limited charge transfer capability, or, indeed, for any application where the gate drive signal is, at least in some use cases, limited in the charge it can deliver in a way that can negatively impact the time taken for the switch transition. For instance, in some applications, there may be current limiting that may be applied to a power supply, that may, in at least some use cases, result in a relatively low charge transfer capability for a gate drive signal derived from that power supply. As an example, there may be times where a relatively low current limit may be applied to avoid drawing too much current from a battery. A relevant switch may thus be implemented as a composite switch and controlled with a suitable temporal sequencing of the switch elements when the low current limit is applied. If, at other times, the low current limit is not applied, and the relevant gate drive derived from the power supply would be able to rapidly turn on the whole of the composite switch, all the switch elements of the composite switch may be enabled together at the start of the switch transition. In some application therefore the temporal sequencing could be dynamically controlled based on the charge transfer capability of the gate drive.

It will also be understood that the examples above have been discussed in the context of a turn on switch transition of a high-side NMOS switch, i.e. a transition of the switch from being off to being on, with the NMOS switch being a standard enhancement mode NMOS switch. The issue of a limited charge transfer capability may particularly apply for turn on of such an NMOS switch and there may not be the same limitations for the opposite switch transition, i.e. for a turn off transition. However, it will be understood that the principles could be applied to any switch transition where the gate drive for charging or discharging of the gate capacitance of the switch may have a limited charge transfer capability. If discharging of the gate of an enhancement-mode NMOS switch as part of a turn off switch transition were limited by a relatively slow rate of charge transfer, consideration could also be given as to whether implementing the relevant switch as a composite switch and sequencing the driving of the gates of the segments would optimise the switch transition, but in this case the sequencing would be applied to effectively turn the switch off as quickly as possible and, if so, the switch could be implemented appropriately. In a turn off switch transition the sequencing may be applied so that the average switch resistance over the course of the transition is closer to the final, high, resistance value than would be the case without the sequencing being applied, i.e. the average switch resistance over the course of the switch transition may be greater than would otherwise be the case.

The principles can also be applied to driving of other types of NMOS switches, such as depletion mode NMOS switches and/or to any type of PMOS switches in applications where the gate drive for the relevant switch has a limited charge transfer capability. Embodiments may also be implemented with semiconductor switches other than MOS switches, for instance, switches implemented in GaN or SiC, or some other compound semiconductor, may also be implemented as a composite switch with switch elements having gates, or equivalent control electrodes, that can be controlled as described in the present disclosure.

The examples above have been discussed in the context of driving a switch of an output stage, which may be an output stage of a switch driver circuit and embodiments of the present disclosure may advantageously be used in audio applications or other applications for driving a transducer, e.g. such as haptic output transducer. However, the output stage could be any output stage for generating a desired output voltage and, in general the principles could be applied to driving of any MOS switch where it is desirable to transition the switch as fast as possible but there is a limited driver capability.

The examples have been illustrated with just one switch of the output stage implemented as a composite switch, but embodiments could be implemented with more than one switch of an output stage being a composite switch.

Embodiments may be implemented as an integrated circuit. Embodiments may be implemented in a host device, especially a portable and/or battery powered host device such as a mobile computing device for example a laptop, notebook or tablet computer, or a mobile communication device such as a mobile telephone, for example a smartphone. The device could be a wearable device such as a smartwatch. The host device could be a games console, a remote-control device, a home automation controller or a domestic appliance, a toy, a machine such as a robot, an audio player, a video player. It will be understood that embodiments may be implemented as part of a system provided in a home appliance or in a vehicle or interactive display. There is further provided a host device incorporating the above-described embodiments.

The skilled person will recognise that some aspects of the above-described apparatus and methods, for instance determining or controlling the sequencing of enabling of the gates of the switch elements, may be embodied as processor control code, for example on a non-volatile carrier medium such as a disk, CD- or DVD-ROM, programmed memory such as read only memory (Firmware), or on a data carrier such as an optical or electrical signal carrier. For some applications, embodiments may be implemented on a DSP (Digital Signal Processor), ASIC (Application Specific Integrated Circuit) or FPGA (Field Programmable Gate Array). Thus, the code may comprise conventional program code or microcode or, for example code for setting up or controlling an ASIC or FPGA. The code may also comprise code for dynamically configuring re-configurable apparatus such as re-programmable logic gate arrays. Similarly, the code may comprise code for a hardware description language such as Verilog™ or VHDL (Very high-speed integrated circuit Hardware Description Language). As the skilled person will appreciate, the code may be distributed between a plurality of coupled components in communication with one another. Where appropriate, the embodiments may also be implemented using code running on a field-(re)programmable analogue array or similar device in order to configure analogue hardware.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single feature or other unit may fulfil the functions of several units recited in the claims. Any reference numerals or labels in the claims shall not be construed so as to limit their scope.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

The invention claimed is:

1. A switching circuit comprising:

a first semiconductor switch, wherein the first semiconductor switch comprises a composite semiconductor switch having a plurality of semiconductor switch elements, each semiconductor switch element having a respective gate electrode; and a switch driver configured to drive the gate electrodes of the plurality of semiconductor switch elements to a first gate voltage over a duration of a first switch transition of the first semiconductor switch;

wherein the switch driver is configured to enable drive of at least some of the gate electrodes of the plurality of semiconductor switch elements at different times in a temporal sequence during the first switch transition, said temporal sequence being configured to provide an average switch resistance for the first semiconductor switch over the duration of the first switch transition which is closer to a final switch resistance of the first semiconductor switch at the end of the first switch transition compared to driving the gate electrodes of the plurality of semiconductor switch elements at the same time as one another.

2. The switching circuit of claim 1 wherein the first switch transition is a turn on transition of the first semiconductor switch and said temporal sequence is configured to provide a reduced average switch resistance for the first semiconductor switch over the duration of the first switch transition compared to driving the gate electrodes of the plurality of semiconductor switch elements at the same time as one another.

3. The switching circuit of claim 2 wherein the first semiconductor switch is a composite NMOS switch and the plurality of semiconductor switch elements comprise NMOS switch elements.

4. The switching circuit of claim 1 wherein the switch driver comprises a voltage generator for generating the first gate voltage.

5. The switching circuit of claim 4 wherein said temporal sequence is based on a charge transfer capability of the voltage generator.

6. The switching circuit of claim 5 further comprising a controller for controlling said temporal sequence, wherein said controller is configured to dynamically vary the temporal sequence in response to variation in the charge transfer capability of the voltage generator.

7. The switching circuit of claim 4 wherein the voltage generator comprises a switching voltage generator configured to repeatedly operable in cycles of switching phases.

8. The switching circuit of claim 7 wherein said temporal sequence is based on the cycles of switching phases of the voltage generator.

9. The switching circuit of claim 4 wherein the voltage generator comprises a charge-pump.

10. The switching circuit of claim 1 wherein the switch driver comprises a switch network for connecting the gate electrodes of the plurality of semiconductor switch elements to a gate drive signal and a controller configured to control said switch network during the first switch transition to implement said temporal sequence.

11. The switching circuit of claim 10 wherein the controller is configured to dynamically control the temporal sequence based on one or more operating parameters.

12. The switching circuit of claim 11 wherein said one or more operating parameters comprises a feedback signal indicative of a gate voltage of one of the plurality of semiconductor switch elements during the first switch transition.

13. The switching circuit of claim 10 wherein the controller is configured to enable drive of a first one of the plurality of semiconductor switch elements and to determine when to subsequently enable drive of a second one of the plurality of semiconductor switch elements based on an indication of a gate voltage of the first one of the plurality of semiconductor switch elements.

14. The switching circuit of claim 1 wherein the switch driver is further configured to drive the gate electrodes of the plurality of semiconductor switch elements to a second gate voltage during a second switch transition of the first semiconductor switch, wherein the second switch transition is an opposite transition to the first switch transition.

15. The switching circuit of claim 14 wherein the switch driver is configured to enable drive of all of the gate electrodes of the plurality of semiconductor switch elements at the same time during the second switch transition.

16. The switching circuit of claim 14 wherein the second switch transition is a turn off transition of the first semiconductor switch.

17. The switching circuit of claim 1 wherein the first semiconductor switch is a high-side switch connected between a high-side voltage node and an output node and the switching circuit also comprises a second semiconductor switch which is a low-side switch connected between the output node and a low-side voltage node.

18. The switching circuit of claim 1 implemented as part of a power regulator or switching driver.

19. A switching circuit comprising:
a composite semiconductor switch having a plurality of semiconductor switch elements, each semiconductor switch element having a respective gate electrode; and
a switch driver configured to connect the gate electrodes of the plurality of semiconductor switch elements to a gate drive signal during a first switch transition of a first semiconductor switch, wherein the switch driver is configured to connect at least some of the gate electrodes of the plurality of semiconductor switch elements to the gate drive signal at different times in a temporal sequence to provide an accelerated change in switch resistance compared to connecting the gate electrodes of the plurality of semiconductor switch elements to the gate drive signal at the same time as one another.

20. A switching circuit comprising:
a composite semiconductor switch having a plurality of semiconductor switch elements, each semiconductor switch element having a respective gate electrode; and
a switch driver configured to receive a gate drive signal from a gate drive supply,
wherein the switch driver is configured to connect the gate electrodes of the plurality of semiconductor switch elements to the gate drive signal during a first switch transition of a first semiconductor switch, and
wherein the switch driver is configured to control connection of the gate drive signal to the gate electrodes during said first switch transition in a temporal sequence based on a characteristic of the gate drive supply.

21. A switching circuit as claimed in claim 20 wherein the connection of the gate drive signal to the gate electrodes in said temporal sequence is controlled to accelerate a change in resistance of the composite MOS switch based on the characteristic of the gate drive supply compared to connecting the gate drive signal to the gate electrodes of the plurality of semiconductor switch elements at the same time as one another.

22. A switching circuit as claimed in claim 20 wherein the characteristic of the gate drive supply comprises one or more of: an instantaneous charge available from the gate drive supply, a current limit of the gate drive supply, a state of health or a state of charge of a battery of the gate drive supply.

\* \* \* \* \*